United States Patent
Lacroix et al.

(10) Patent No.: US 6,260,163 B1
(45) Date of Patent: *Jul. 10, 2001

(54) TESTING HIGH I/O INTEGRATED CIRCUITS ON A LOW I/O TESTER

(75) Inventors: Luke D. Lacroix, Williston; Leo A. Noel, Essex Junction, both of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,551

(22) Filed: Dec. 12, 1997

(51) Int. Cl.$^7$ .................................................. G01R 31/28
(52) U.S. Cl. ............................................................ 714/726
(58) Field of Search .................................. 714/718, 719, 714/724, 733, 734, 735, 726, 727; 324/158.1

(56) References Cited

U.S. PATENT DOCUMENTS

| | | | |
|---|---|---|---|
| 4,241,307 | * 12/1980 | Hong | 324/73.1 |
| 4,348,759 | 9/1982 | Schnurmann | 371/20 |
| 4,694,242 | 9/1987 | Petrson et al. | 324/73 |
| 5,107,208 | 4/1992 | Lee | 324/158 R |
| 5,121,394 | * 6/1992 | Russell | 714/724 |
| 5,198,757 | 3/1993 | Azumai | 324/158 R |
| 5,331,571 | 7/1994 | Arnoff et al. | 364/490 |
| 5,379,300 | 1/1995 | Yamahata et al. | 371/15.1 |
| 5,446,395 | 8/1995 | Goto | 324/763 |
| 5,488,612 | 1/1996 | Heybruck | 371/22.2 |
| 5,513,190 | 4/1996 | Johnson et al. | 371/22.5 |
| 5,517,515 | 5/1996 | Spall et al. | 371/22.5 |
| 5,535,165 | 7/1996 | Davis et al. | 365/201 |
| 5,541,935 | 7/1996 | Waterson | 371/22.5 |

FOREIGN PATENT DOCUMENTS 58-209135   12/1983   (JP) .

OTHER PUBLICATIONS

S. L. Dingle et al., "The Advantages of Boundary–Scan Testing," Apr. 16–18, 1991, 9th Annual IEEE Test Symposium, Atlantic City, New Jersey.

* cited by examiner

Primary Examiner—Hoa T. Nguyen
(74) Attorney, Agent, or Firm—James M. Leas

(57) ABSTRACT

A method for testing high I/O chips on low I/O testers is provided. Chips having programmable I/Os are used with an interface board that shorts groups of I/Os to a single tester channel. Patterns are provided to the chip to enable one I/O of each group at a time, thereby allowing all I/Os in each group to be tested sequentially. Thus, a multiplexing function is divided between the chip itself and the interface board.

38 Claims, 5 Drawing Sheets

TESTING HIGH I/O INTEGRATED CIRCUITS ON A LOW I/O TESTER

FIELD OF THE INVENTION

This invention generally relates to a method of testing electronic devices. More particularly, it relates to testing high I/O integrated circuits on a low I/O tester

BACKGROUND OF THE INVENTION

Electronic devices, such as semiconductor chips are usually tested before being shipped to customers. This testing verifies that the chip design meets the function it was designed for and checks for any manufacturing defects. The tests include patterns of 1's and 0's to test the internal circuits and logic on the chip and to test the chip's inputs/ outputs (I/O). I/O can be (receivers), outputs (drivers), and combined input/outputs that provide both the receiver and the driver function connected to one chip pad.

As described in a paper, "The Advantages of Boundary-Scan Testing, by S. L. Dingle et al." published in the Proceedings of the 9th IEEE Test Symposium, Atlantic City, N.J., Apr. 16–18, 1991, boundary scan has been used to reduce the number of I/O pins requiring simultaneous contact for testing the logic of chips designed according to level sensitive scan design (LSSD) rules. In an LSSD design, all latches are part of a scannable chain. Boundary scan adds the requirement that each driver and receiver must have an associated latch that is also part of a scannable chain. Therefore, with boundary scan and LSSD, it is possible to directly control and observe the state of all drivers, receivers, and latches on chip while contacting only scan pins (including boundary scan pins), clocks, and LSSD control pins. In this manner, a low-pin-count tester can effectively test all of a chip's area except the chip circuitry outside the boundary scan latches. The circuits not tested by the LSSD/boundary-scan test can be parametrically tested, either by multiplexing on the product/tester interface board or by adding low-cost parametric pins to the tester. Thus, although the internal circuits and logic can usually be tested through a relatively small number of the chip's pads, each chip I/O must still be contacted separately to accomplish its test.

On semiconductor chips having many I/O, testers have been used that have one tester I/O channel for each chip I/O. However, this approach has become increasingly costly, especially as the number of chip I/O exceeds 512. Multiplexing two or more chip I/O to one tester channel with relays on an interface board between the tester and the chip have avoided the expense of high I/O testers. But the relays have raised the size, cost and complexity of interface boards and their control software. In addition, series resistance introduced by the relays have degraded the ability to accurately test chip performance.

Thus, a better solution for testing chips having a large number of I/Os is needed that eliminates the need for relays and reduces the cost and complexity of interface boards while providing that low I/O testers can still be used, and this solution is provided by the present invention.

SUMMARY OF THE INVENTION

It is therefore an object of the present invention to provide a low cost and high performance way to test high I/O count integrated circuits with a low I/O count tester.

It is a feature of the present invention that the integrated circuit is designed to have control over the on/off state of the drivers.

It is a feature of the present invention that tester front end hardware shorts groups of I/Os to each tester channel.

It is an advantage of the present invention that significantly decreased cost of testing high I/O chips is achieved while improving the accuracy of testing.

These and other objects, features, and advantages of the invention are accomplished by a method of testing an electronic assembly, the method comprising the steps of:
 (a) providing an electronic assembly having m I/Os, said electronic assembly having enabling switches to control the activation state of said I/Os;
 (b) providing a tester having n I/O channels, n being less than m, said tester having front end hardware;
 (c) shorting a plurality of said m I/Os in said tester front end hardware;
 (d) using the enabling switches of step (a) and activating a first I/O of the plurality of shorted I/Os on the chip while leaving others of said plurality inactive; and
 (e) providing a stimulation to test a chip function through said first I/O.

BRIEF DESCRIPTION OF THE FIGURES

The foregoing and other objects, features, and advantages of the invention will be apparent from the following detailed description of the invention and accompanying drawings, in which.

DETAILED DESCRIPTION OF THE INVENTION

The present invention is a method for testing high I/O chips on low I/O testers. In brief, chips having programmable I/Os are used with an interface board that shorts groups of I/Os to a single tester channel. Patterns are provided to the chip to enable one I/O of each group at a time, thereby allowing all I/Os in each group to be tested sequentially. Thus, the multiplexing function is divided between the chip itself and the interface board. Applicant notes that boundary scan provides control over programmable I/Os, and these are already in use on many chips, the program enabling tri-stating outputs (putting the output in a high impedance state) for boundary scan testing. The present invention takes advantage of this design to provide the on-chip portion of the multiplexing function, significantly improving and lowering the cost of testing of high I/O chips. The invention is also applicable to chips not having programmable boundary scan latches as described hereinbelow.

Figure 1:
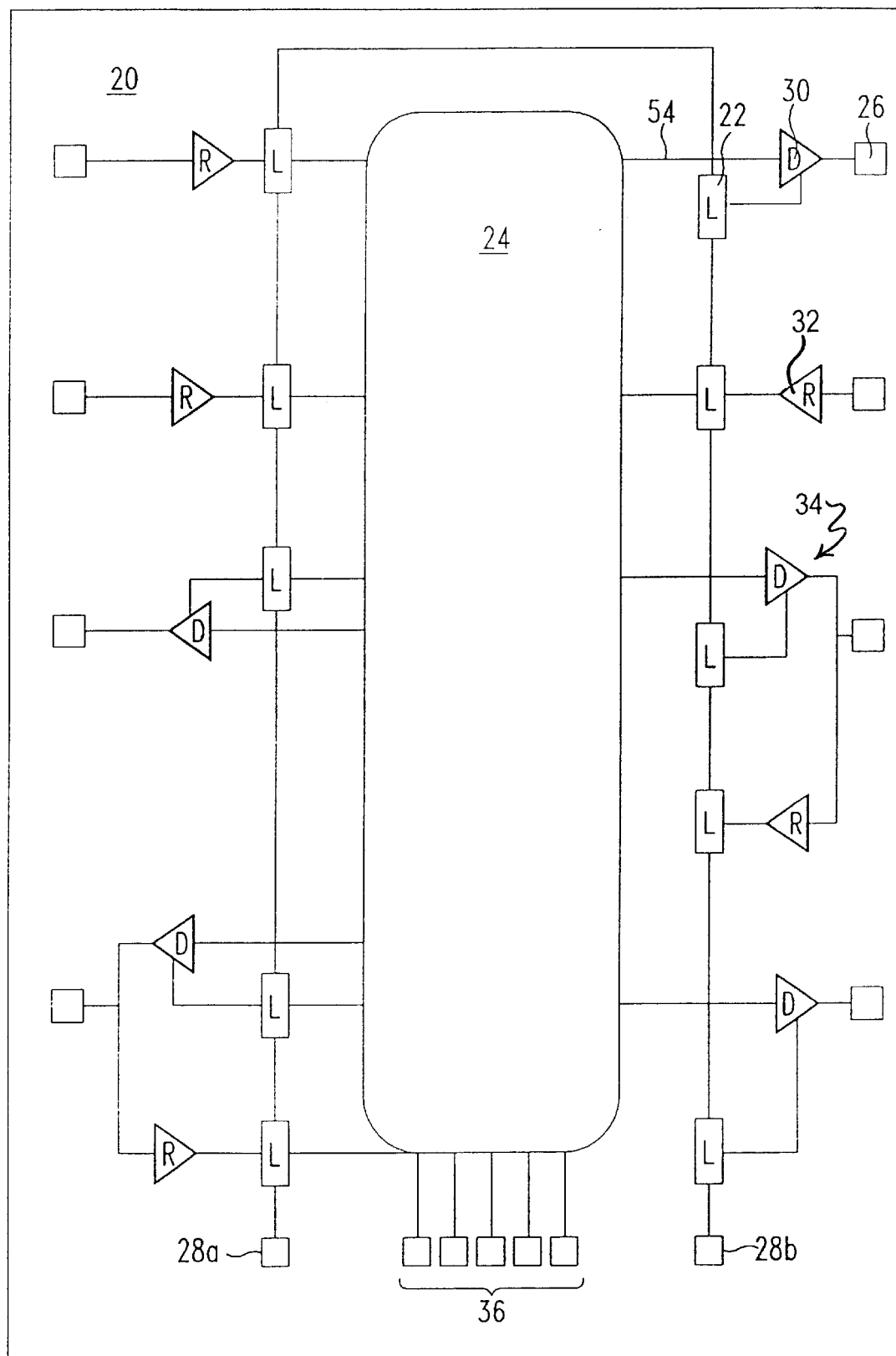
FIG. 1 is a schematic diagram of an integrated circuit chip having an internal logic region and a region external to the logic having I/O and latches.

FIG. 1 shows chip 20 segmented by boundary scan latches 22 into internal logic region 24 and external circuitry located between boundary scan latches 22 and its associated I/O pad 26. Internal region 24 can be fully tested by applying stimulus and measuring outputs on scan I/O pads 28a, 28b, tester I/O pads 36, and a few other control pads. External testing detects defects that are located between boundary scan latch 22 and I/O pads 26, including drivers 30, receivers, 32, and combined driver-receiver circuits 34. External testing tests driver and receiver functions including I/O leakage, output-driver-current, receiver-input-levels, and driver-output levels. These tests verify that receiver threshold and driver-output specifications can be met at worst case power supply voltages and worst-case driver-load conditions. Until the present invention, to accomplish these external tests either testers having a large number of I/O have been required or complex multiplexors have been needed on device interface boards.

The present invention takes advantage of the existing boundary scan latches to avoid multiplexing on the interface board while reducing the number of pins to be contacted and tester channels required to parametrically test I/O circuits external to the boundary scan latches. The invention uses the boundary scan latches to electronically provide a portion of the multiplexing previously entirely provided on the device interface board (DIB). The invention eliminates the need for relays on the DIB for this purpose and allows groups of chip pads to simply be shorted together on the DIB.

Figure 2:
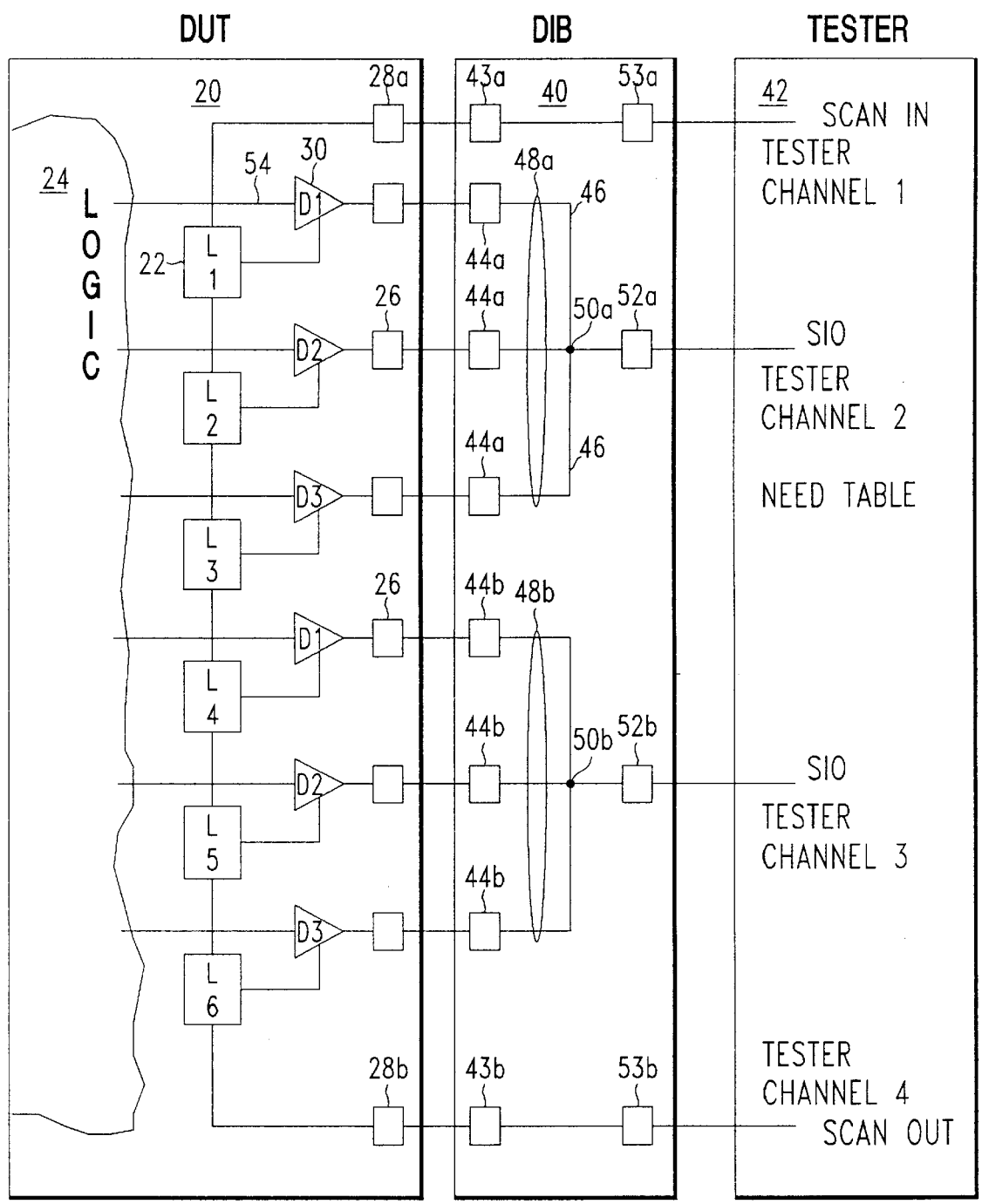
FIG. 2 is a schematic diagram showing the connections between the drivers on the integrated circuit of FIG. 1, a device interface board (DIB) and a tester.

FIG. 2 shows in block diagram portions of chip 20, device interface board 40, and tester 42 as they are connected for the present invention. Chip 20 has boundary scan latches 22, drivers 30, and I/O pads 26. DIB 40 is a printed circuit board that provides customized connection between chip 20 and tester 42. DIB 40 includes pads 43a, 43b for pin connection with boundary scan pads 28a, 28b of chip 20, and pads 44a, 44b, for pin connection with I/O pads 26 of chip 20. Lines 46 extending from pads 44a in group 48a meet at point 50a where they are electrically shorted together and connected to pad 52a for connection to tester channel 2. Similarly, pads 44b in group 48b are electrically shorted together at point 50b and connected to pad 52b for connection to tester channel 3. Thus, a multiplexor has been formed where a portion of the multiplexing task is located on the chip to be tested and a portion is performed on a DIB contacting the chip. The on-chip portion determines which driver in a group of drivers is to be enabled while assuring that all other drivers in the group are tri-stated, or left in a high impedance state. The remaining portion of the multiplexing task, accomplished on DIB 40 with lines 46, is very simple: shorting the members of the group to be sequentially tested.

Tester 42 includes tester channels 1 and 4 connected to chip scan-in and scan-out pads 28a, 28b through DIB pads 53a, 53b and 43a, 43b. Tester 42 also includes tester channels 2 and 3 for connection to shorted groups 48a and 48b at pads 52a and 52b on DIB 40. Pins (not shown) between DIB 40 and tester 42 provide these connections. Latches 22 control the state of their associated drivers 30. For example, a driver is enabled if its associated latch has a 1. Alternatively a driver is tri-state if the associated latch has a 0. To test a driver of each group a pattern of 1s and 0s is provided by tester channel 1 through scan-in pads 53a, 43a, and 28a to latches 22. The pattern must provide only one member of each group of drivers with an enabling signal from its associated latch, all others being tri-stated.

In the example of three latches grouped together shown in FIG. 2, the test of drivers D1 is accomplished by providing a pattern on scan-in pad 28a to provide the pattern "001 001," on latches 22. Thus, a logical "1" is loaded into latches L1 and L4 and a logical "0" is loaded into latches L2, L3, L5, and L6. This enables drivers D1 in both groups and tri-states all other drivers in both groups. Then through pads 36 (FIG. 1), internal logic 24 is programmed to provide the appropriate data on lines 54, the inputs of drivers 30. Through tester channels 2 and 3, the tester applies tests to both D1 drivers, the only ones enabled, and reads results through tester channels 2 and 3. In the next step, a "0" is applied to scan-in pad 28a to provide the pattern 010 010, enabling the D2 drivers and tri-stating all others. The testing is repeated and the results obtained on tester channels 2 and 3 now concern drivers D2. In the next step, a "0" is applied to scan-in pad 28a to provide the pattern 100 100 enabling the D3 drivers and tri-stating all others. The testing is repeated and the results obtained on tester channels 2 and 3 now concern drivers D3. Thus, the tester receives test data from the drivers in each group sequentially without the need for relays on the DIB, the only structure being required on the DIB are wires for shorting I/O pads of chip 20 together into groups.

The grouping of pads is provided on the DIB; no modification of a product chip is needed for chips already having boundary scan latches that drive the enable line of the driver. The number of pads grouped together on DIB 40 is determined by the number of I/O pads 26 on chip 20 and the number of tester channels available on tester 42. For example a chip having 1124 signal I/O may require 64 of these signal I/O to be contacted for the internal logic testing (pads 36 in FIG. 1). These 64 I/O receive patterns of 1s and 0s from the tester to put logic 24 in a predictable state and to observe that logic. The remaining 1060 signal I/O require only the external testing described hereinabove to ensure that their external circuitry is operating properly. If a 256 pin tester is used for testing the chip, 256−64=192 pins are available for testing these 1060 signal I/O, and therefore groups must have an average of 5.5 pins. One possibility is to form 170 groups on DIB 40 each having 6 signal I/O shorted together while forming 8 groups each with 5 signal I/O shorted together.

Figure 3:
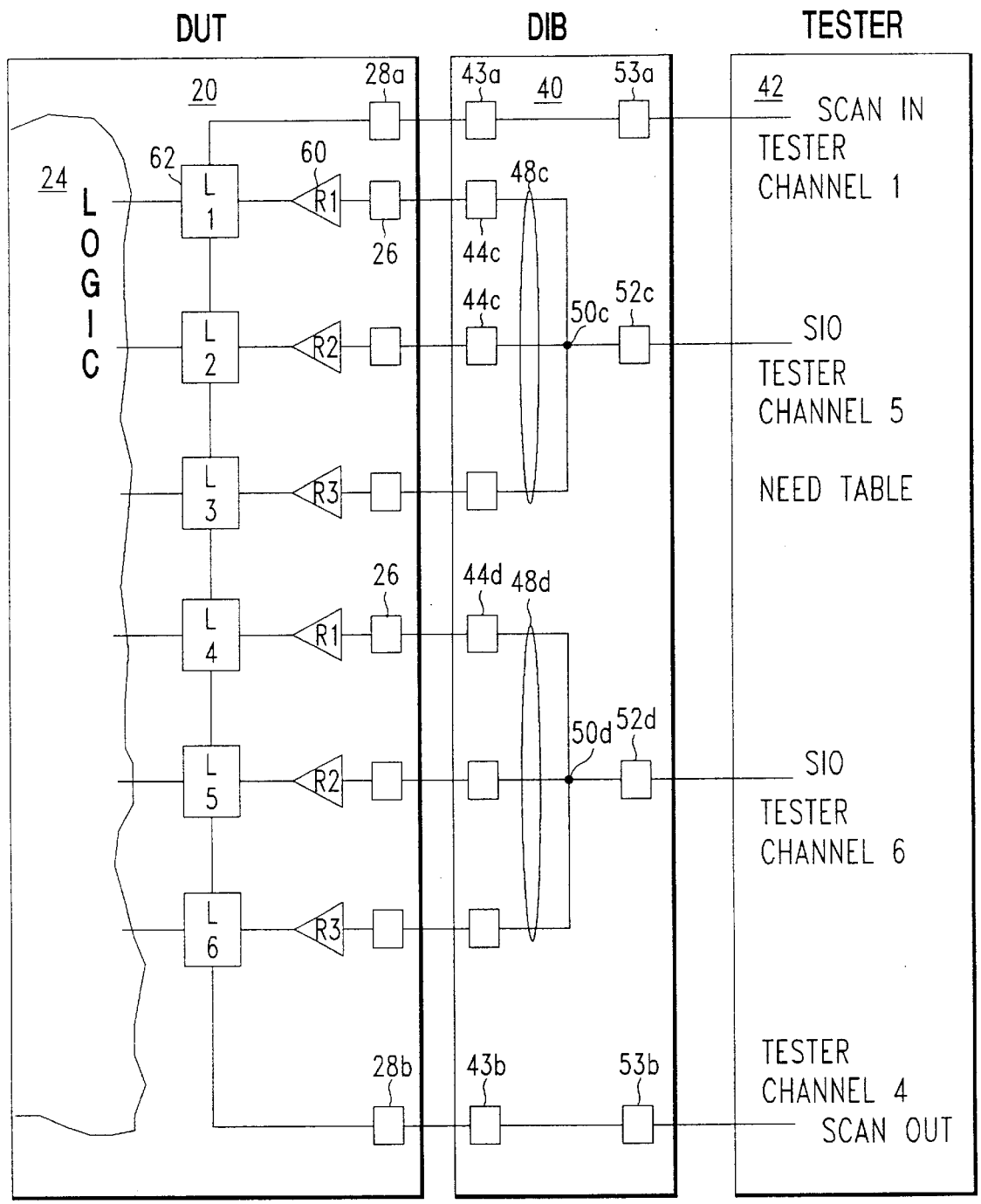
FIG. 3 is a schematic diagram showing the connections between receivers on the integrated circuit of FIG. 1, a device interface board (DIB) and a tester.

The present invention also applies to receiver I/Os on chip 20 as illustrated in FIG. 3. Here receivers 60 are grouped and shorted together on DIB 40 as described hereinabove, but no enable control is needed between latches 62 and receivers 60 on product chip 20 as was used for drivers 30 (FIG. 2). Tester 42 applies identical stimulus to all receivers 60 through tester channels 5 and 6, pads 52c, 52d, shorted point 50c, 50d, and pads 44c and 26. The stimulus is propagated from receivers 60 to latches 62. The data in latches 62 is then scanned out to tester channel 4 to verify that all receivers are properly functioning. If all receivers in a particular group are the same type, such as TTL or CMOS, then a single pattern can properly stimulate all the receivers in that group. However, if the receivers in a group are of different types, requiring different signals for activation, then the test need be repeated until all receivers in the group have been stimulated.

The present invention also applies to bidirectional I/Os. In this case the two techniques described hereinabove for drivers and receivers are performed sequentially.

Figure 4:
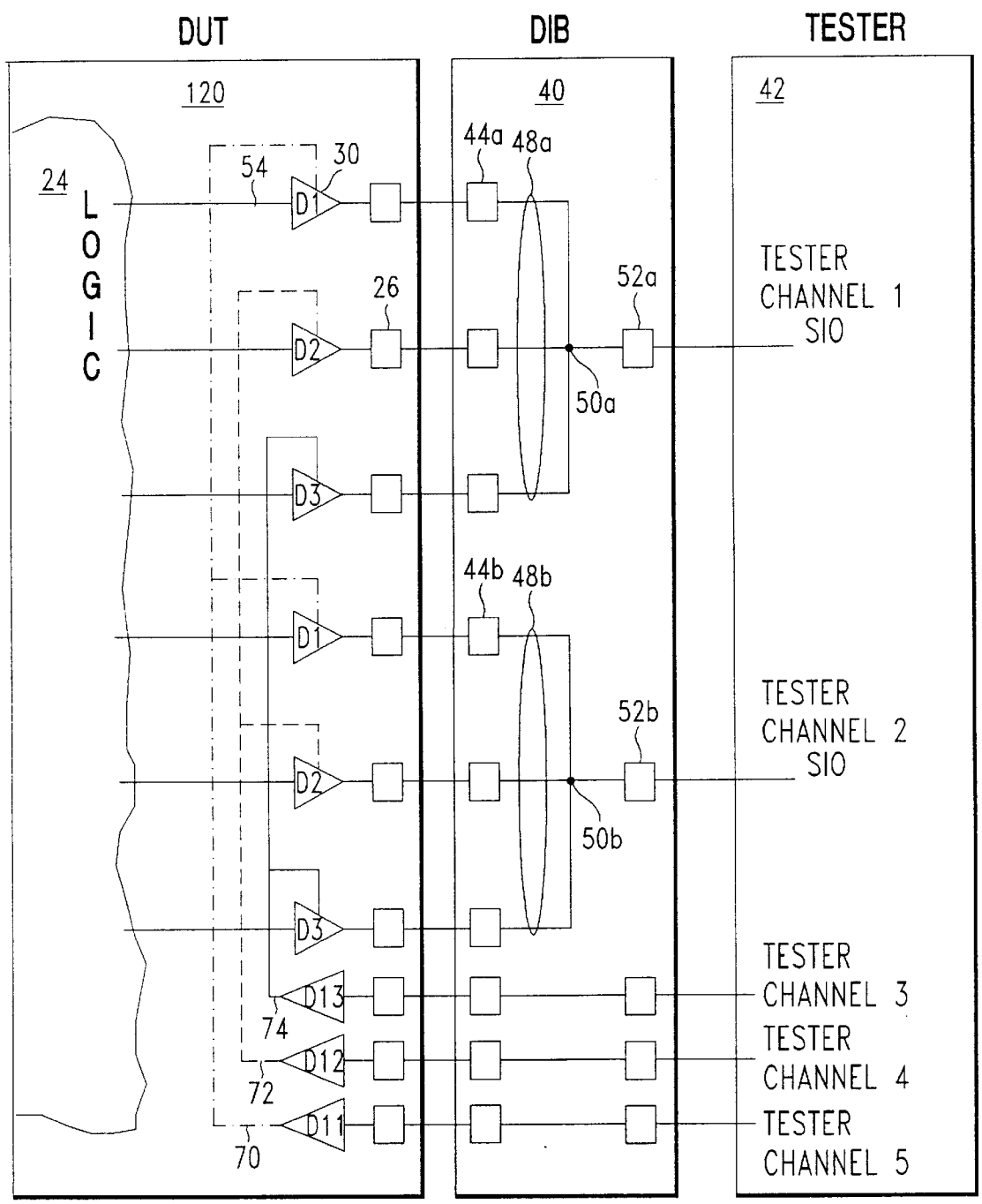
FIG. 4 is a schematic diagram showing the connections between drivers on an integrated circuit chip having driver inhibit lines instead of latches, a device interface board (DIB) and a tester.

The present invention also applies to chips not having boundary scan latches. Patterns applied by tester 42 to driver inhibit (DI) lines connected to drivers in groups assigned on-chip are used instead of latches, as shown in FIG. 4. One driver inhibit line is needed for each member of a group defined on a chip. Thus, instead of a latch providing the signal, driver inhibit lines provide signals to all I/O drivers in a group, putting all drivers in each group into a high impedance state except the one driver being tested.

In the example illustrated in FIG. 4, in the first step, a pattern is applied from tester 42 that provides a logical 1 on tester channel 5 and a logical 0 on tester channels 3 and 4 enabling driver D1 and tri-stating drivers D2 and D3 in groups 48a and 48b. Thus, though the outputs of all three drivers are shorted together on DIB 40, only drivers D1 of each group are connected to tester channels 1 and 2 in tester 42. The test is then applied through test I/O and internal logic 24 to test drivers D1 in all groups. In the next step a second pattern is applied from tester 42 that provides a logical 1 on tester channel 4 and a logical 0 on tester channels 3 and 5, enabling driver D2 and tri-stating drivers D1 and D3 in groups 48a and 48b. The test is then applied through test I/O and internal logic 24 to test drivers D2 in all groups. Following a similar process, drivers D3 are tested.

Figure 5:
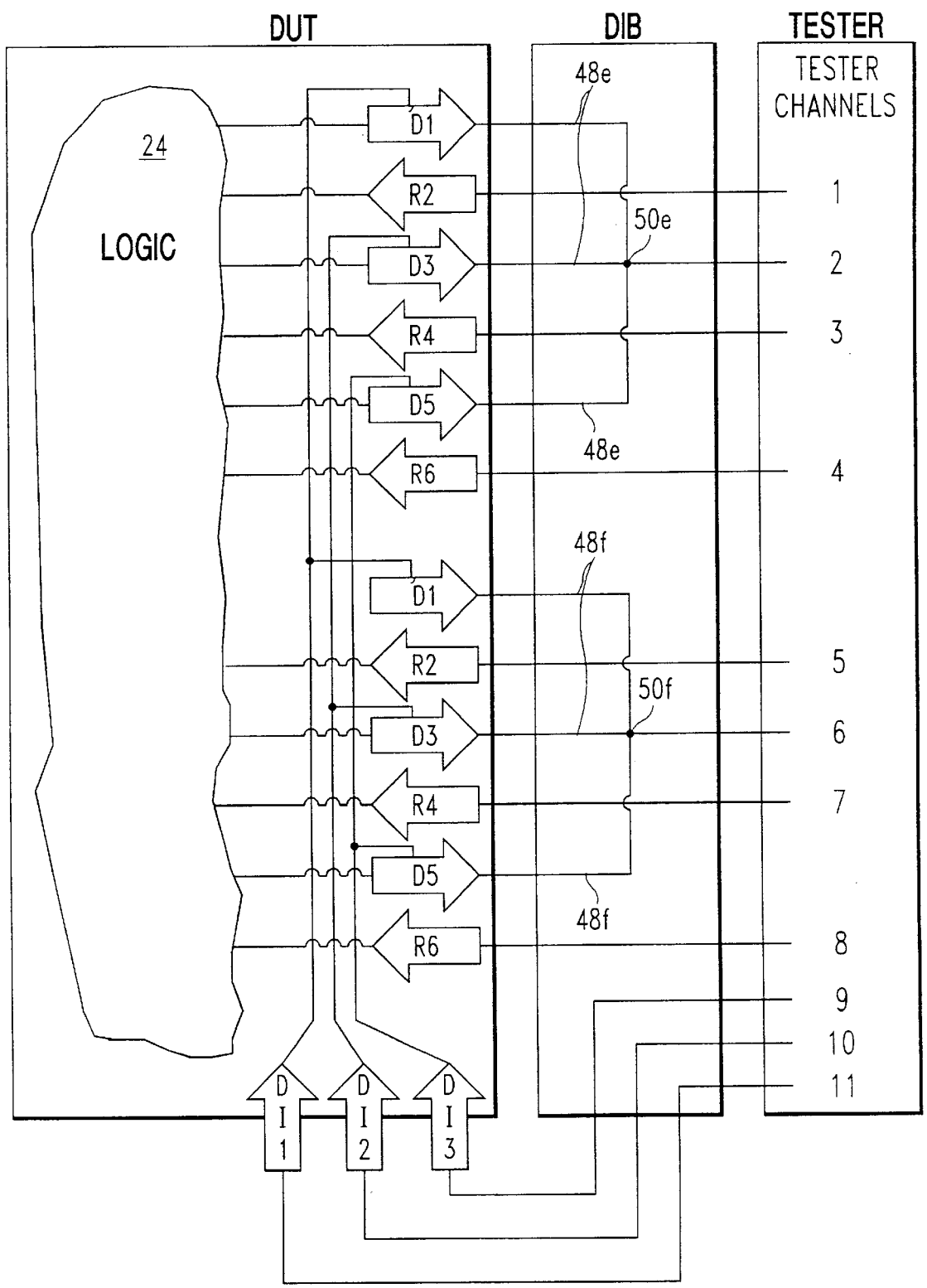
FIG. 5 is a schematic diagram showing the connections between bidirectional I/O (drivers and receivers) on an integrated circuit chip having driver inhibit lines instead of latches, a device interface board (DIB) and a tester.

For integrated circuits not designed for testing with test I/O, receivers and drivers can still be tested with the method of the present invention, as shown in FIG. 5. Receivers R2, R4, and R6 in each group are not grouped together; they are connected through DIB 40 to individual tester channels 1, 3, 4, 5, 7, and 8. Test patterns are applied from these tester channels through the receivers to internal logic region 24. The applied patterns and internal logic determine the states of the outputs of drivers D1, D3, and D5 of each group, which are shorted together in groups on DIB 40. However, patterns are also applied to driver inhibit lines, one for each member of driver groups 48e, 48f formed on DIB 40 to enable only one driver from each group, as described herein above. The parametric or functional tests are applied and verified on tester channels 2 and 6 connected to shorted points 50e, 50f for each driver inhibit condition to test each driver output until all drivers are tested. Thus, receivers, drivers, and internal logic are tested with a reduced number of I/O for chips not designed for testing with a reduced pin count tester. The number of tester channels used for drivers is reduced by a factor equal to the number of drivers in each group. Though the number of tester channels used for receivers is not reduced, the overall number of tester channels can be substantially reduced, particularly for chips having a large number of drivers.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of using an electronic component, the method comprising the steps of:
   (a) providing an electronic component having a plurality of signal I/Os having an active state and a high impedance state, said electronic component having means for controlling the activation state of said I/Os;
   (b) contacting said plurality of I/Os with a structure for shorting said plurality of I/Os together, said structure having an output for providing a signal from said shorted I/Os;
   (c) using said means for controlling of said step (a) to cause a first I/O of said plurality of shorted I/Os on the electronic component to be in an active state; and
   (d) receiving a signal from said first I/O through said output.

2. A method as recited in claim 1, wherein said means for controlling comprise enabling switches.

3. A method as recited in claim 2, wherein said enabling switches comprise transistors.

4. A method as recited in claim 1, wherein said means for controlling comprise driver inhibit lines.

5. A method as recited in claim 1, further comprising the step of causing all others of said plurality of shorted I/Os to be in a high impedance state.

6. A method as recited in claim 1, wherein said signal comprises a signal for testing said component.

7. A method as recited in claim 1, further comprising the step of providing a stimulation to said component and testing a component function through said first I/O.

8. A method as recited in claim 7, further comprising the step of causing all others of said plurality of shorted I/Os to be in a high impedance state.

9. A method as recited in claim 8, further comprising the step of causing said first I/O of said plurality of shorted I/Os on the component to be in a high impedance state while causing a second I/O of said plurality to be in an active state, and providing a stimulation to said component and testing a component function through said second I/O.

10. A method as recited in claim 7, wherein said testing step comprises one of functional tests and DC parametric tests.

11. A method as recited in claim 7, wherein said I/O include a plurality of receivers, said shorting step shorting said plurality of receivers together, wherein said testing step comprises the step of providing a signal to all said receivers simultaneously and collecting receiver outputs to verify receiver functionality.

12. A method as recited in claim 7, wherein said I/O include a plurality of drivers, said shorting step shorting said plurality of drivers together, wherein said testing step comprises the step of enabling one said driver, providing a signal to all said drivers simultaneously and collecting shorted driver outputs to verify enabled driver functionality.

13. A method of testing an electronic assembly, the method comprising the steps of:
   (a) providing an electronic assembly having m I/Os, said I/Os having an enabled state and a high impedance state, said electronic assembly having means for controlling the activation state of said I/Os;
   (b) providing a tester having n I/O channels, n being less than m, said tester having front end hardware;
   (c) shorting a plurality of said m I/Os in said tester front end hardware;
   (d) using said control means of step (a) and activating a first I/O of said plurality of shorted I/Os on the assembly while leaving others of said plurality in a high impedance state; and
   (e) providing a stimulation to test an assembly function through said first I/O.

14. A method as recited in claim 13, wherein said electronic assembly comprises one of a chip, a module, a card, and a system.

15. A method as recited in claim 13, wherein said means for controlling comprises enabling switches.

16. A method as recited in claim 15, wherein said enabling switches comprise transistors.

17. A method as recited in claim 13, wherein said signal comprises a signal for testing said assembly.

18. A method as recited in claim 13, further comprising the step of providing a stimulation to said assembly to test a assembly function through said first I/O.

19. A method as recited in claim 13, where said testing step (e) comprises one of functional tests and DC parametric tests.

20. An electronic assembly, comprising:

an integrated circuit chip having a plurality of I/Os; and a structure outside said chip for shorting a group of said I/Os to each other, wherein each said I/O is accessible independently through said shorting structure.

21. A electronic assembly as recited in claim 20, wherein said I/Os have an active state and a high impedance state, said chip comprising means for controlling the activation state of said plurality of I/Os.

22. A electronic assembly as recited in claim 21 wherein said means for controlling comprise enabling switches.

23. A electronic assembly as recited in claim 22, wherein said enabling switches comprise transistors.

24. A electronic assembly as recited in claim 21, wherein said means for controlling comprise driver inhibit lines.

25. A electronic assembly as recited in claim 21, wherein said means for controlling comprises means for providing one said shorted I/O in said active state and all others of said plurality of shorted I/Os in said high impedance state.

26. A test system, comprising:

an electronic assembly having m I/Os, said electronic assembly having a first enabling switch to control the activation state of a first of said I/Os and a second enabling switch to control the activation state of a second of said I/Os;

a tester having n I/O channels, n being less than m, said tester having front end hardware for grouping said m I/Os into q groups, q being equal to or less than n, wherein a first group of said q groups comprises said first and said second I/Os, said front end hardware shorting together said first and said second I/Os;

an activator within said electronic assembly for activating said first enabling switch while said second enabling switch is inactive and then for deactivating said first enabling switch and activating said second enabling switch; and a first test signal provided between said electronic assembly and said tester through said first I/O while said first enabling switch is activated and a second test signal provided between said electronic assembly and said tester through said second I/O while said second enabling switch is activated.

27. A test system as recited in claim 26, wherein said enabling switches comprise transistors.

28. A test system as recited in claim 26, wherein a first driver is connected to said first I/O and a second driver is connected to said second I/O, wherein said activator comprises driver inhibit lines for setting said first driver in an active state while leaving said second driver in a high impedance state.

29. A test system as recited in claim 26, further comprising a third I/O, said third I/O comprising a third driver, said front end hardware shorting together said first, said second, and said third I/O and said first, said second and said third driver, wherein said activator provides all but one of said shorted drivers in a high impedance state.

30. A test system as recited in claim 26, wherein said first test signal comprises a signal for testing said assembly through said first I/O.

31. A test system as recited in claim 30, wherein said first test signal provides a stimulation to said assembly and tests an assembly function through said first I/O.

32. A test system as recited in claim 31, wherein said second I/O is in a in a high impedance state while said first test signal is provided to said first I/O.

33. A test system as recited in claim 26, wherein a first driver is connected to said first I/O and a second driver is connected to said second I/O, wherein said front end hardware shorting said first and said second I/Os shorts said drivers together, wherein said activator comprises driver inhibit lines for setting said first driver in an active state while leaving said second driver in a high impedance state, wherein said test signal is provided to said first and said second I/O simultaneously and wherein a first driver output is collected to verify said first driver functionality.

34. A test system as recited in claim 26, wherein said first I/O on the assembly is in a high impedance state while said second I/O is in an active state and said second test signal is provided to said second I/O.

35. A test system as recited in claim 26, wherein said first test signal comprises one of functional tests and DC parametric tests.

36. A test system as recited in claim 26, wherein a first receiver is connected to said first I/O and a second receiver is connected to said second I/O, wherein said front end hardware shorting said I/Os shorts said receivers together, wherein a test signal is provided to all said receivers simultaneously, and wherein receiver outputs are collected to verify receiver functionality.

37. A test system as recited in claim 35, wherein said receiver outputs are collected on a scan chain.

38. A test system as recited in claim 33, wherein said first driver output is collected on a scan chain.

* * * * *